United States Patent
Danesh et al.

(10) Patent No.: US 10,236,447 B2
(45) Date of Patent: Mar. 19, 2019

(54) SELECTIVE DIE REPAIR ON A LIGHT EMITTING DEVICE ASSEMBLY

(71) Applicant: GLO AB, Lund (SE)

(72) Inventors: Fariba Danesh, Pleasanton, CA (US); Frank Patterson, Sunnyvale, CA (US); Timothy Gallagher, Pleasanton, CA (US); Sharon N. Farrens, Boise, ID (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/597,654

(22) Filed: May 17, 2017

(65) Prior Publication Data

US 2017/0346011 A1   Nov. 30, 2017

Related U.S. Application Data

(60) Provisional application No. 62/340,692, filed on May 24, 2016.

(51) Int. Cl.
  *H01L 27/32*  (2006.01)
  *H01L 51/00*  (2006.01)
  *H01L 51/56*  (2006.01)

(52) U.S. Cl.
  CPC ...... *H01L 51/0031* (2013.01); *H01L 27/3218* (2013.01); *H01L 51/003* (2013.01); *H01L 51/56* (2013.01); *H01L 2251/568* (2013.01)

(58) Field of Classification Search
  None
  See application file for complete search history.

(56) References Cited

U.S. PATENT DOCUMENTS

| | | |
|---|---|---|
| 2009/0278142 A1 | 11/2009 | Watanabe et al. |
| 2010/0186883 A1 | 7/2010 | Tomoda |

(Continued)

FOREIGN PATENT DOCUMENTS

| | | |
|---|---|---|
| JP | 2006140398 A | 6/2006 |
| JP | 2003332633 A | 11/2013 |

(Continued)

OTHER PUBLICATIONS

International Search Report and Written Opinion of the International Searching Authority for International Patent Application No. PCT/US2017/033032, dated Aug. 31, 2017, 11 pages.

(Continued)

*Primary Examiner* — Shaun M Campbell
(74) *Attorney, Agent, or Firm* — The Marbury Law Group PLLC

(57) ABSTRACT

A method of repairing a light emitting device assembly includes providing a light emitting device assembly including a backplane and light emitting devices, where a predominant subset of pixels in the light emitting device assembly includes an empty site for accommodating a repair light emitting device, generating a test map that identifies non-functional light emitting devices in the light emitting device assembly, providing an assembly of a repair head and repair light emitting devices, wherein the repair light emitting devices are located only on locations that are mirror images of empty sites within defective pixels that include non-functional light emitting devices, and transferring the repair light emitting devices from the repair head to the backplane in the empty site in the defective pixels.

16 Claims, 16 Drawing Sheets

(56) References Cited

U.S. PATENT DOCUMENTS

| | | |
|---|---|---|
| 2013/0285086 A1 | 10/2013 | Hu et al. |
| 2014/0267683 A1* | 9/2014 | Bibl ................... H01L 51/50 |
| | | 348/87 |
| 2015/0111329 A1 | 4/2015 | Wu et al. |
| 2016/0064363 A1 | 3/2016 | Bower et al. |
| 2016/0093600 A1 | 3/2016 | Bower et al. |
| 2016/0093665 A1 | 3/2016 | Schubert et al. |
| 2018/0069149 A1* | 3/2018 | Zou ................... H01L 33/0095 |

FOREIGN PATENT DOCUMENTS

| | | |
|---|---|---|
| KR | 20020027253 A | 4/2002 |
| WO | WO2014149864 A1 | 9/2014 |
| WO | WO2016022824 A1 | 2/2016 |
| WO | WO2016100657 A2 | 6/2016 |
| WO | WO2016100662 A1 | 6/2016 |

OTHER PUBLICATIONS

International Search Report and Written Opinion of the International Searching Authority for International Patent Application No. PCT/US2017/017830, dated May 23, 2017, 12 pages.
U.S. Appl. No. 15/339,194, filed Oct. 31, 2016, Glo AB.
U.S. Appl. No. 15/429,338, filed Feb. 10, 2017, Glo AB.
U.S. Appl. No. 15/432,216, filed Feb. 14, 2017, Glo AB.
U.S. Appl. No. 15/485,747, filed Apr. 12, 2017, Glo AB.
International Preliminary Report on Patentability and Written Opinion of the International Searching Authority for International Patent Application No. PCT/US2017/033032, dated Dec. 6, 2018, 8 pages.

* cited by examiner

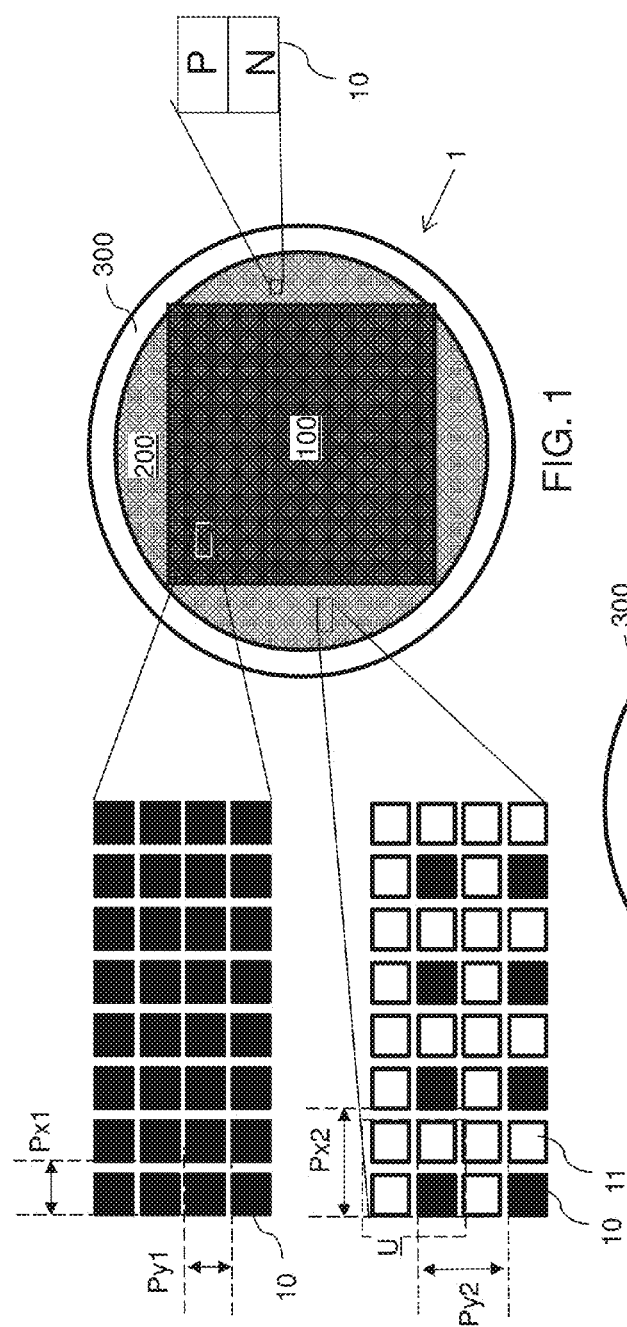
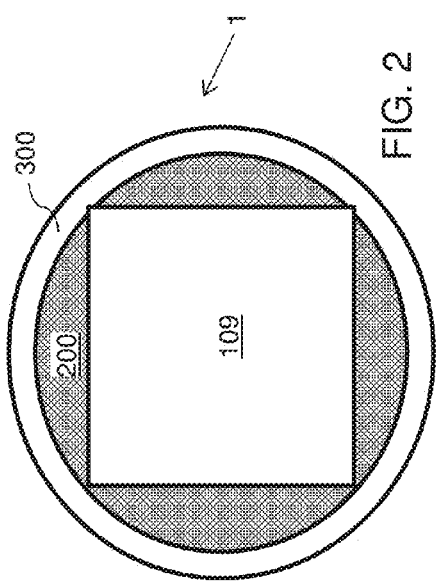
FIG. 1
FIG. 2

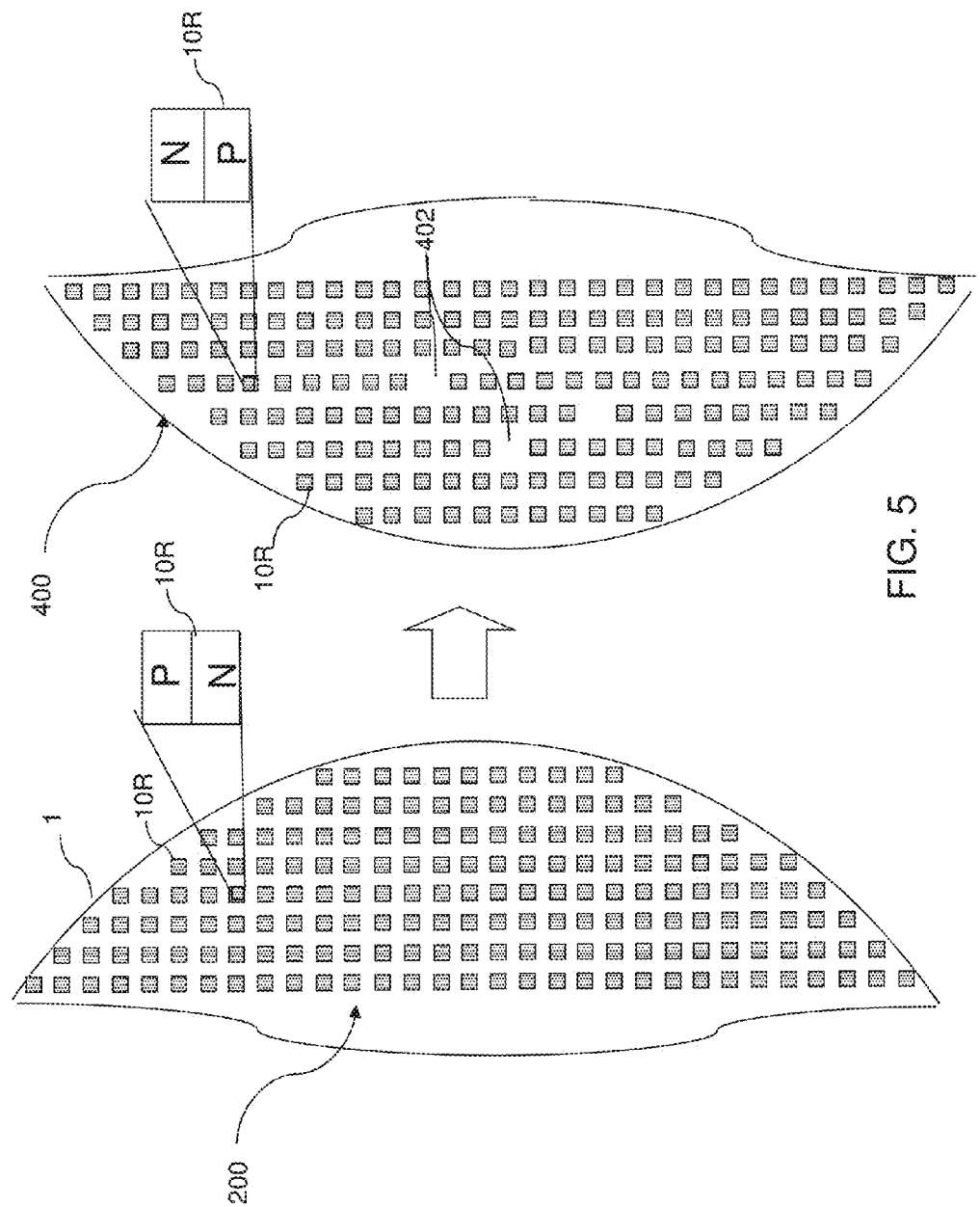

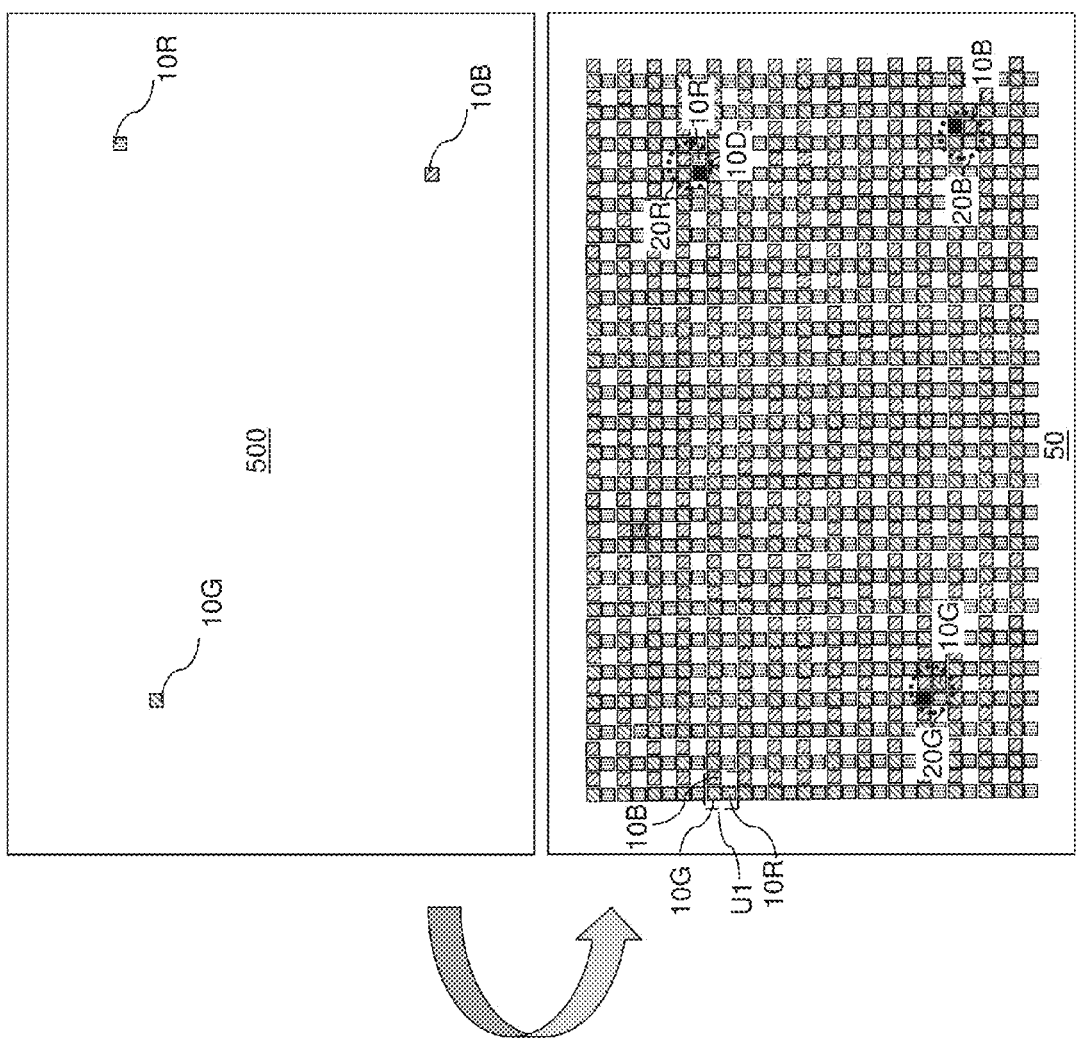

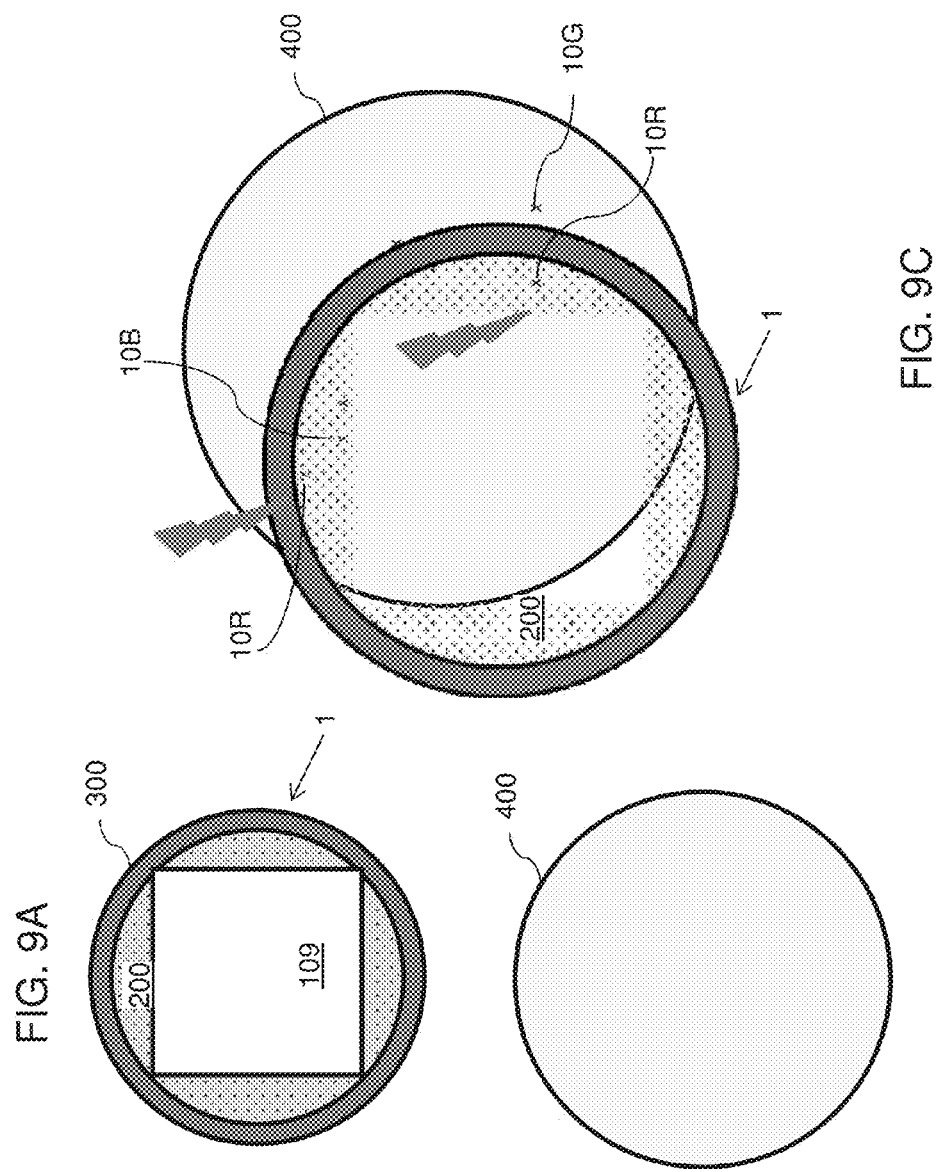

US 10,236,447 B2

SELECTIVE DIE REPAIR ON A LIGHT EMITTING DEVICE ASSEMBLY

RELATED APPLICATIONS

The instant application claims the benefit of priority from U.S. Provisional Application No. 62/340,692 filed on May 24, 2016, which is incorporated herein by reference in their entirety for all purposes.

FIELD

The embodiments of the invention are directed generally to a method of manufacturing semiconductor light emitting devices, and specifically to a method of manufacturing a light emitting device assembly including a backplane and light emitting devices, and structures for effecting the same.

BACKGROUND

Light emitting devices such as light emitting devices are used in electronic displays, such as liquid crystal displays in laptops or LED televisions. Light emitting devices include light emitting devices (LEDs) and various other types of electronic devices configured to emit light.

SUMMARY

According to an aspect of the present disclosure, a method of repairing a light emitting device assembly includes providing a light emitting device assembly including a backplane and light emitting devices, where a predominant subset of pixels in the light emitting device assembly includes an empty site for accommodating a repair light emitting device, generating a test map that identifies non-functional light emitting devices in the light emitting device assembly, providing an assembly of a repair head and repair light emitting devices, wherein the repair light emitting devices are located only on locations that are mirror images of empty sites within defective pixels that include non-functional light emitting devices, and transferring the repair light emitting devices from the repair head to the backplane in the empty site in the defective pixels.

According to another aspect of the present disclosure, a method of manufacturing an assembly of a backplane and light emitting devices comprises providing a plurality of growth substrates, each comprising a central region containing central light emitting devices and a peripheral region containing repair light emitting devices, transferring the central light emitting devices from the central region of at least one of the plurality of growth substrates to a backplane to form a light emitting device assembly including the backplane and the transferred light emitting devices, where a predominant subset of pixels in the light emitting device assembly includes an empty site for accommodating the repair light emitting device, generating a test map that identifies non-functional light emitting devices in the light emitting device assembly, transferring the repair light emitting devices from the peripheral region of at least one of the plurality of growth substrates to a first transfer substrate, transferring the repair light emitting devices from the first transfer substrate to a second transfer substrate; and transferring the repair light emitting devices from the second transfer substrate to the backplane in the empty site in the defective pixels.

According to another aspect of the present disclosure, a substrate comprises repair light emitting devices in a peripheral region of the substrate and central light emitting devices in a central region of the substrate. The repair light emitting devices are arranged in the peripheral region at a lower density than a density of the central light emitting devices arranged in the central region.

BRIEF DESCRIPTION OF THE DRAWINGS

FIG. 1 schematically illustrates a substrate including a base pitch region and a repair device supply region according to an embodiment of the present disclosure.

FIG. 2 schematically illustrates the substrate of FIG. 1 after transfer of the light emitting devices from the base pitch region according to an embodiment of the present disclosure.

FIG. 5 is a plan view showing a step of transfer of dies from a device supply region to a first transfer substrate, (e.g., a film frame or repair device supply coupon), according to an embodiment of the present disclosure.

FIG. 7 is a vertical cross-sectional view and FIGS. 8A and 8B are plan views showing a step of transfer of dies from the second transfer substrate to first and second backplanes according to embodiments of the present disclosure.

FIGS. 9A to 9G are plan views showing the steps of transferring dies from the device supply region to a third backplane using first and second transfer substrates with wafer mapping according to an alternative embodiment of the present disclosure.

DETAILED DESCRIPTION

Figure 3A:
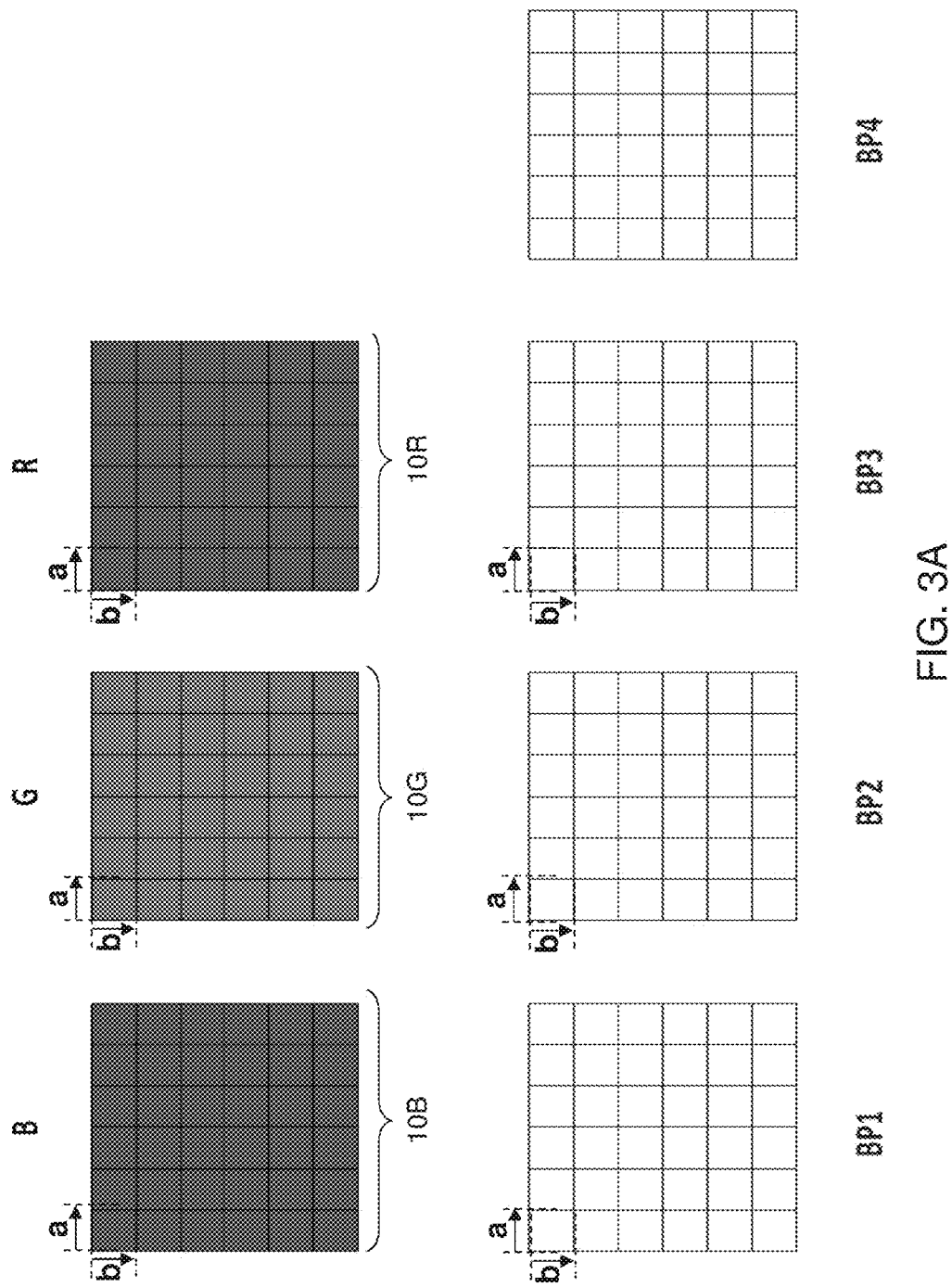
FIGS. 3A-3E are a schematic sequence for transfer of light emitting devices according to the exemplary transfer pattern illustrated in FIG. 2.

As stated above, the present disclosure is directed to an assembly of integrated back light units, and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting device (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a carrier structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane" or a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Devices of a same type can be fabricated on respective initial growth substrates. As used herein, an "initial growth substrate" refers to a substrate that is processed to form devices thereupon or therein. The devices can include light emitting devices and/or sensor devices (e.g., photodetectors) and/or any other electronic devices. The light emitting devices can be any type of light emitting devices, i.e., vertical light emitting devices, lateral light emitting devices, or any combination thereof. Devices of the same type can be formed on each initial growth substrate, the types being different from one initial growth substrate to another. The devices can be formed as an array on the respective initial growth substrates.

Utilization of a high percentage of light emitting devices as manufactured on an initial growth substrate for incorporation into backplanes is desirable for economically manufacturing a direct view light emitting device assembly. Generally, a light emitting device assembly provides a rectangular viewing area, while initial growth substrates typically have circular device areas. After transfer of light emitting devices from a rectangular central region of an initial growth substrate to a backplane, a circular substrate can have a peripheral unutilized region from which devices are not transferred. Methods of the present disclosure provide methods for utilizing devices from the peripheral region as repair die for the backplane using an odd number of transfer steps (e.g., at least 3 transfer steps) and at least two transfer substrates to make sure that the repair die on the backplane have a p-n junction that faces in the same direction as the p-n junction of the initial die transferred to the backplane from the rectangular central region of an initial growth substrate. This ensures that all LED die on the backplane are connected in the same direction (i.e., that all p-side electrodes on the backplane connect to p-sides of the LED dies (also called "dice") and all n-side electrodes on the backplane connect to n-sides of the LED dies).

The methods of the present disclosure employ one of more of the following methods. An assembly of dies on a backplane can be tested to generate a defective die map. In one embodiment, the defective dies can be removed selectively from the backplane if they interfere with the operation of the device which includes the backplane (e.g., if the defective dies cause a short circuit). Alternatively, if the defective dies do not interfere with the operation of the device which includes the backplane (e.g., if they cause an open circuit due to inoperability or improper placement/electrode contact on the backplane), then they are left on the backplane. Each pixel or unit on the backplane which contains a defective die preferably has an empty die attachment site which is referred to as a repair site herein. A defect map may be generated based on the electrical and/or optical (e.g., light emission) testing of the dice in each pixel. Repair dies (i.e., instances of a light emitting device) can be transferred from the peripheral region of the growth substrate to a first transfer substrate, then from the first transfer substrate to a second transfer substrate, and finally from the second transfer substrate to empty repair sites in the pixels on the backplane where the defective dice are located. The color (e.g., the peak emission wavelength, such as a emission light color) of the repair dies is matched to the color of the defective dies in each pixel based on the defect map.

Referring to FIG. 1, a substrate 1 including a base pitch region (e.g., rectangular central region) 100 and a repair device supply (e.g., peripheral) region 200 is illustrated. The substrate 1 may comprise a growth substrate on which the devices are initially grown or it may comprise a transfer substrate to which the devices are transferred directly or indirectly from the growth substrate. The substrate 1 may include an annular edge exclusion region 300 at a periphery, in which devices 10 are not formed. The base pitch region 100 can include central light emitting devices of a same type (which is herein referred to as first type) arranged in a first array configuration. The light emitting devices of the first type are multiple instances of the same device, which may be, for example, light emitting devices that emit light at a same peak wavelength. For example, the light emitting devices of the first type may be red light emitting devices, green light emitting devices, or blue light emitting devices.

In one embodiment, the first array configuration has a first primary-direction pitch Px1 along a respective primary direction (i.e., the primary direction of the first array configuration) and has a first secondary-direction pitch Py1 along a respective secondary direction (i.e., the secondary direction of the first array configuration). As used herein, a primary direction and a second direction of an array configuration refer to two directions along which a unit cell of the array configuration is repeated. In a rectangular array configuration, the primary direction and the second direction may be perpendicular to each other, and are referred to as an x-direction and a y-direction.

The repair device supply region 200 includes additional repair light emitting devices 10 of the first type arranged in a second array configuration which may be the same or different from the first array configuration. Preferably, the central and repair light emitting devices on the same growth substrate are of the same type and have the same peak emission wavelength. If the first and the second array configurations are different from each other, then the devices in the second array configuration in the repair device supply region 200 may have a greater pitch (i.e., inter-device spacing) than the devices in the first device array configuration in the base pitch region 100. If the array configurations are the same, then the devices in regions 200 and 100 may have the same pitch. Further, the repair device supply region 200 may include empty sites 11 in which light emitting devices are absent. The second array configuration has a second primary-direction pitch Px2 along a respective primary direction (i.e., the primary direction of the second array configuration) and has a second secondary-direction pitch Py2 along a respective secondary direction (i.e., the secondary direction of the second array configuration). In one embodiment, the second primary-direction pitch can be a first integer multiple of the first primary-direction pitch, and the second secondary-direction pitch can be a second integer multiple of the first secondary-direction pitch. As used herein, an "integer multiple" of a number refers to another number that is obtained by multiplying a positive integer to the number. In one embodiment, at least one of the first integer multiple and the second integer multiple is greater than 1. In one embodiment, the first integer multiple is 2, and the second integer multiple is 2. However, if the array configurations in regions 100 and 200 are the same, then the integer multiple equals to 1. In one embodiment, if the empty sites 11 are present in the repair device supply region 200, then the density of repair light emitting devices 10 in the repair device supply region 200 can be less than the density of central light emitting devices 10 in the base pitch region 100. For example, the density of light emitting devices 10 in the repair device supply region 200 can be the same as the product of the density of light emitting devices in the base pitch region 100, the reciprocal of the first integer multiple, and the reciprocal of the second integer multiple.

In one embodiment, a unit cell U of the second array configuration of the repair device supply region 200 is defined by a rectangle having a first pair of sides having a first length of the second primary-direction pitch Px2 along a respective primary direction and having a second pair of sides having a second length of the second secondary-direction pitch Py2 along a respective secondary direction, and includes a single instance of the additional light emitting devices.

Referring to FIG. 2, the central light emitting devices 10 from the base pitch region 100 of the substrate 1 can be transferred directly or indirectly (via intermediate transfer substrates) to multiple backplanes having bonding sites in the second array configuration. After transfer of the light emitting devices 10 from the base pitch region 100, the base pitch region can become a device-free region 109 in which the light emitting devices 10 are absent.

The light emitting devices 10 of the base pitch region 100 can be transferred to multiple backplanes employing a predetermined transfer pattern and a predetermined transfer sequence. Light emitting devices of different types provided from a different base pitch region in a different substrate can be employed in conjunction with the light emitting devices 10 of the base pitch region 100 to provide a functional direct view light emitting device assembly.

Referring to FIGS. 3A-3E, an exemplary transfer pattern and an exemplary transfer sequence are illustrated for transferring three different types of devices (10B, 10G, 10R) (e.g., blue, green and red emitting LEDs, respectively) to three backplanes (BP1, BP2, BP3, BP4). The three different types of devices (10B, 10G, 10R) can be provided on three source substrates (B, G, R), which can comprise three transfer substrates, or three growth substrates, or combinations thereof. The first light emitting devices 10B can be provided on the first source substrate B, the second light emitting devices 10G can be provided on the second source substrate G, and the third light emitting devices 10R can be provided on the third source substrate R.

Figure 3B:
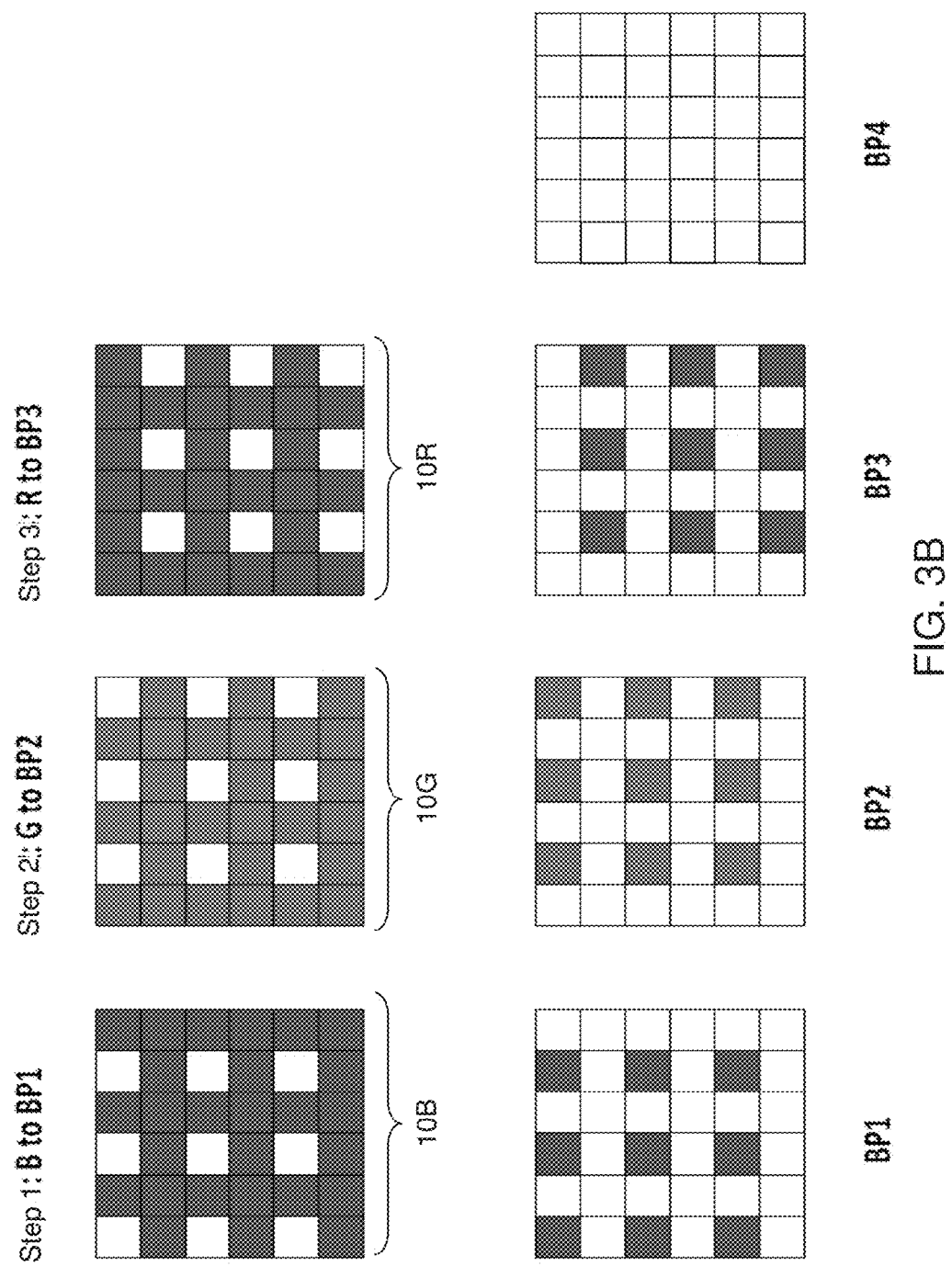
Figure 3C:
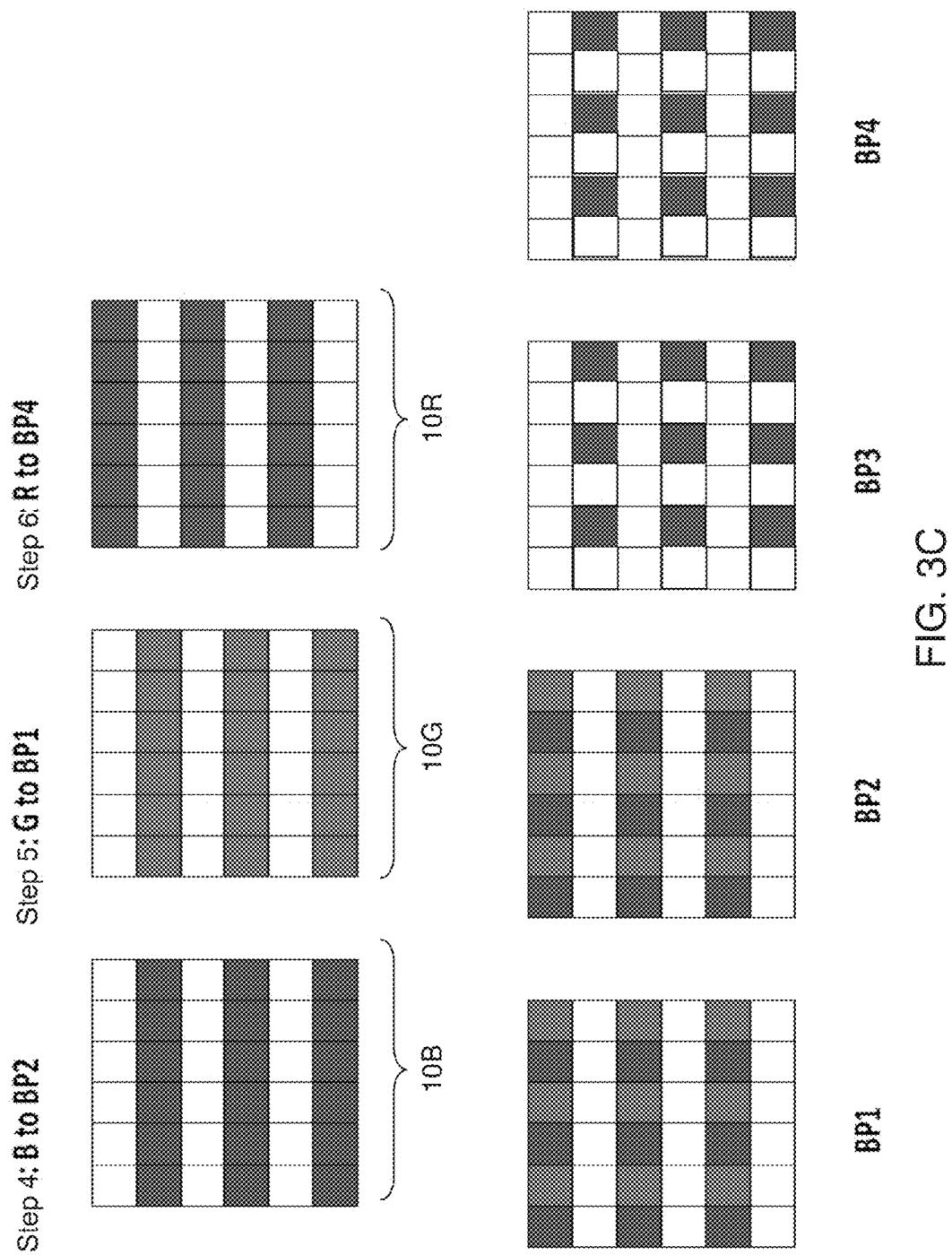
Figure 3D:
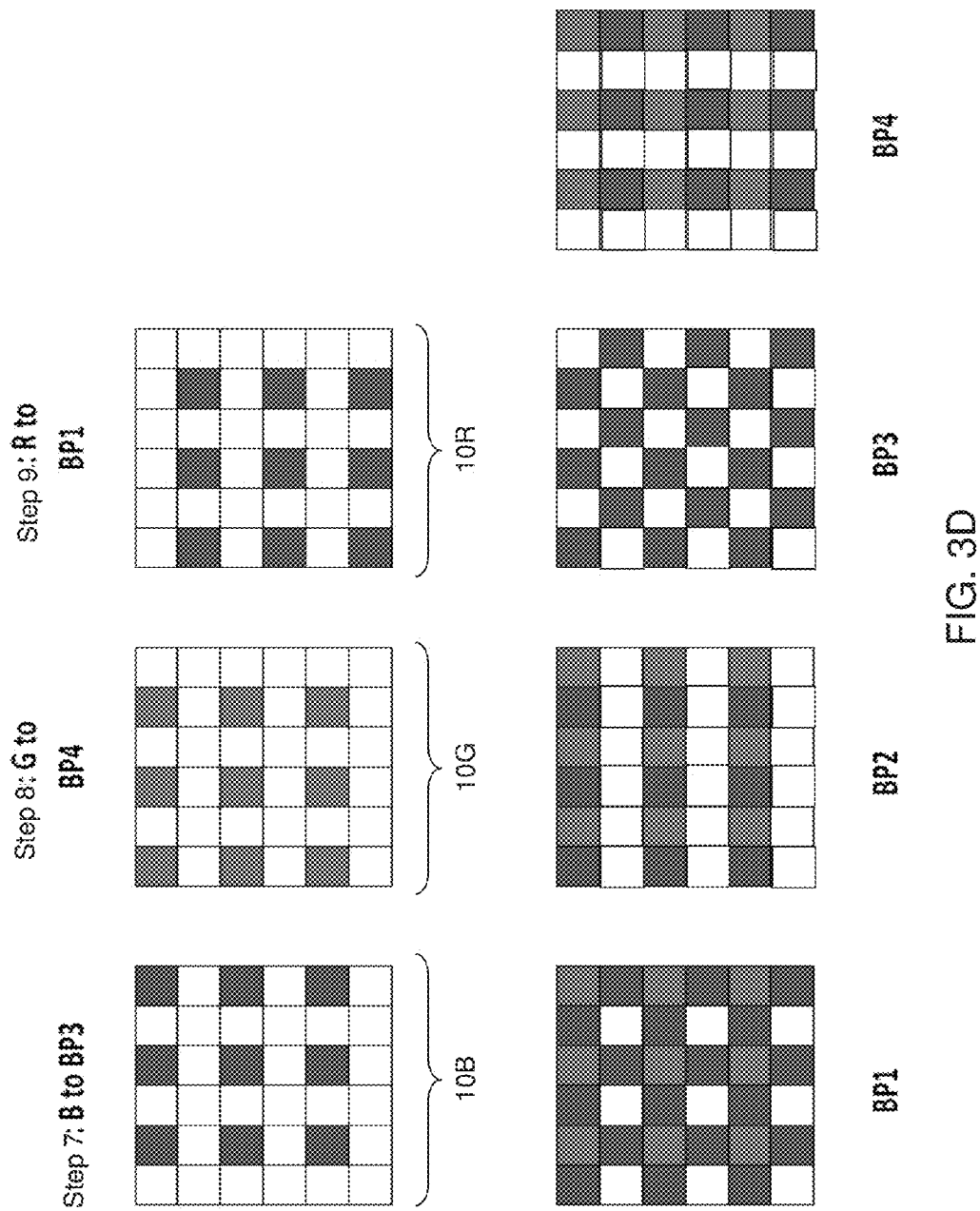
Figure 3E:
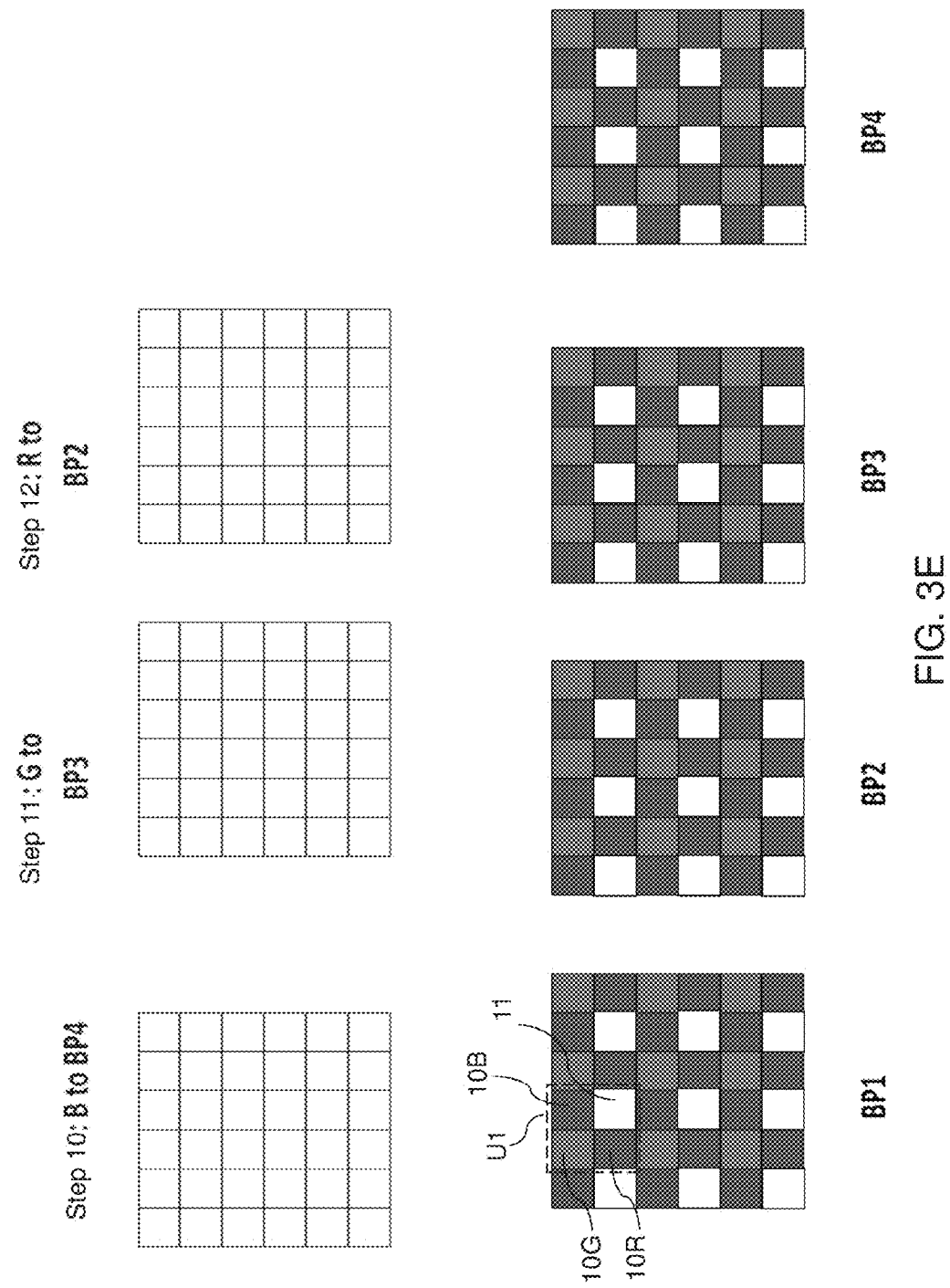

Changes in the presence or absence of the various devices (10B, 10G, 10R) on the source substrates (B, G, R) and the backplanes (BP1, BP2, BP3, BP4) at each step of the transfer sequence are illustrated in FIGS. 3A-3E. FIG. 3A corresponds to a configuration prior to any transfer of the devices (10B, 10G, 10R), FIG. 3B corresponds to the configuration after performing transfer steps 1-3, FIG. 3C corresponds to the configuration after performing steps 4-6, FIG. 3D corresponds to the configuration after performing steps 7-9, and FIG. 3E corresponds to the configuration after performing steps 10-12. It should be noted that steps 1-3 as illustrated in FIG. 3B may be shuffled in any order because steps 1-3 are independent of one another, steps 4-6 as illustrated in FIG. 3C may be shuffled in any order because steps 4-6 are independent of one another, steps 7-9 as illustrated in FIG. 3D may be shuffled in any order because steps 7-9 are independent of one another, and steps 10-12 as illustrated in FIG. 3E may be shuffled in any order because steps 10-12 are independent of one another.

While the exemplary transfer pattern and the exemplary transfer sequence is illustrated for cases in which four source substrates (B, G, R) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. The n backplanes bond with devices from the m transfer assemblies to form n integrated light emitting device assemblies. In one embodiment, n can be the same as, or greater than, m.

A plurality of transfer assemblies, e.g., m transfer assemblies, is provided. Each of the m transfer assemblies comprises a respective source substrate (B, G, R) and respective devices (10B, 10G, 10R) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit conductive bonding structures pattern configured to mount m types of devices.

Each of the m types of devices can be one of the devices within a respective transfer assembly among the m transfer assemblies. The pitches of each unit conductive bonding structures pattern along two independent directions within each of the n backplanes can be multiples of a respective pitch of the two-dimensional periodicity of the devices within each of the m transfer assemblies. In an illustrative example, each of the devices (10B, 10G, 10R) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of 2a (which is an integer multiple of a) along a first direction, and with the second periodicity of 2b (which is an integer multiple of b) along a second direction (which may be perpendicular to the first direction).

Subsets of devices (10B, 10G, 10R) from each of the m transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R), if any, that are previously bonded to the respective backplane (BP1, BP2, BP3, BP4).

In one embodiment, a unit cell U1 of the second array configuration of the light emitting device assembly can be defined by a rectangle having a first pair of sides having a first length of the second primary-direction pitch Px2 along a respective primary direction and having a second pair of sides having a second length of the second secondary-direction pitch Py2 along a respective secondary direction. In one embodiment, the unit cell U1 can include a first-type light emitting device 10R (which may be a red light emitting device), a second-type light emitting device 10G (which may be a green light emitting device), a third-type light emitting device 10B (which may be a blue light emitting device), and a respective empty site 11 configured to accommodate a respective repair light emitting device. Thus, the unit cell forms a light emitting pixel, such as a red, green and blue light emitting pixel which can appear as white light emitting pixel to a human observer if red, green and blue light is emitted at the same time from the devices in the pixel. Alternatively, the pixel can emit red light, green light, blue light or any mixtures thereof.

If each of the first, second, and third-type light emitting devices (10R, 10G, 10B) of a pixel is functional, such a pixel is a functional pixel, and attachment of any repair light emitting device to the pixel is not necessary. If any of the first, second, and third-type light emitting devices (10R, 10G, 10B) of a pixel is defective, i.e., non-functional, then such a pixel is a defective pixel, i.e., a non-functional pixel, and attachment of a repair light emitting device to the pixel may be performed. In this case, the empty site 11 of such a defective pixel is employed to attach a repair light emitting device. Each empty site 11 of the defective pixels is a repair site to which a repair light emitting device may to be attached.

In general, the light emitting device assembly includes a backplane and instances of light emitting devices at bonding sites in an array configuration. The array configuration on the backplane may be the same as the second array configuration in the repair device supply region 200 on the substrate 1 or it may be different from the configuration in region 200.

Repair sites can be identified for any given light emitting device assembly, which may be formed employing the light emitting devices from the substrate 1 including the base pitch region 100, and/or employing light emitting devices from additional or different substrates. In one embodiment, a first set of repair sites can be defined based on the functionality of one type of light emitting devices, e.g., light emitting devices of the first type (e.g., red light emitting devices). Each of the first set of repair sites can be an empty site 11 configured to accommodate a respective repair light emitting device (e.g., red light emitting devices). Each of the first set of repair sites can be located within a pixel including a defective instance of the light emitting device of the first type. The same steps can be carried out for the devices of the second and third types (e.g., green and blue light emitting devices).

Figure 4A:
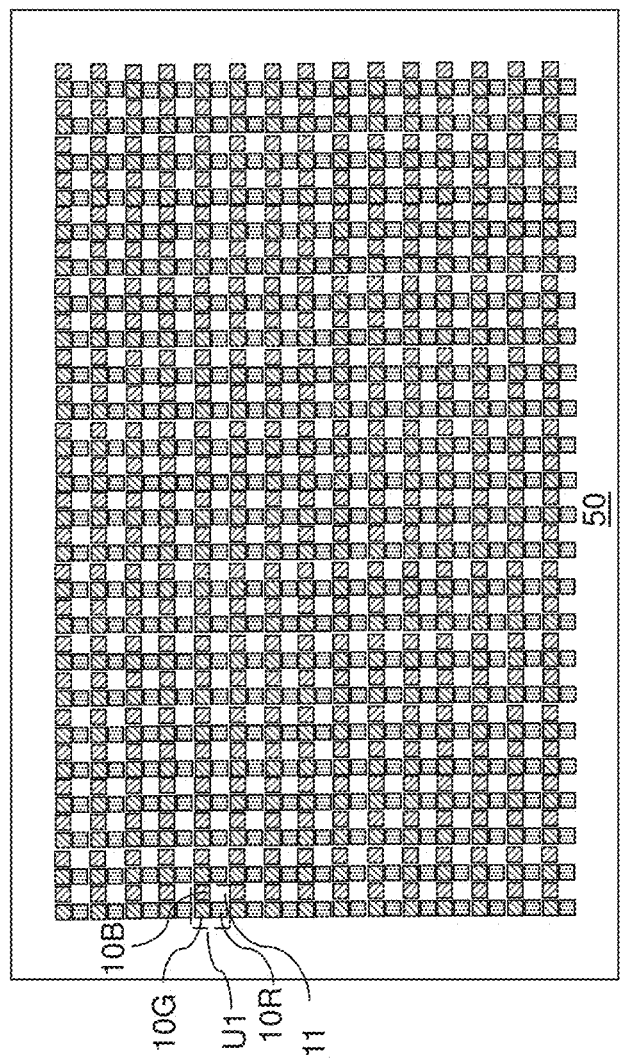
FIG. 4A is a plan view of an exemplary assembly of a backplane and light emitting devices according to an embodiment of the present disclosure.

Referring to FIG. 4A, an assembly of a backplane 50 and light emitting diodes (10R, 10G, 10B) after the assembly process of FIGS. 3A-3E is shown. The assembly may be a direct view display device where the light from the light emitting devices is viewed directly by a human observer (i.e., without using an intervening liquid crystal material of a liquid crystal display). The light emitting diodes (10R, 10G, 10B) and the empty repair sites 11 constitute a two-dimensional array of unit cells U1 (i.e., pixels). Multiple instances of the unit cell U1 can be repeated along two horizontal directions to form the two-dimensional array. The two-dimensional array may be, for example, a rectangular array or a hexagonal array.

Figure 4B:
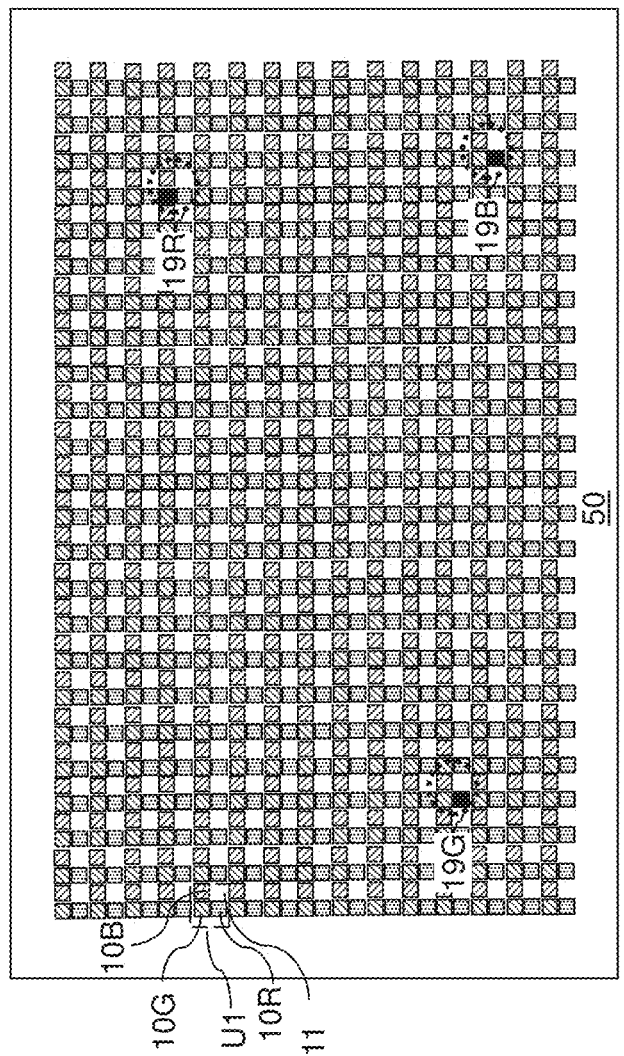
FIG. 4B is a plan view of the exemplary assembly of a backplane and light emitting devices of FIG. 4A and associated defective die map according to an embodiment of the present disclosure.

Referring to FIG. 4B, a test map is generated from the assembly of the backplane 50 and the light emitting diodes (10R, 10G, 10B) by testing (e.g., electrically and/or optically) each pixel for functionality. Each pixel can consist of a unit cell U1 including one set of a first-type light emitting device 10R, a second-type light emitting device 10G, a third-type light emitting device 10B and an empty repair site 11. Each failure in functionality can be categorized as a fail of a first-type light emitting device 10R, a fail of a second-type light emitting device 10G, or a fail of a third-type light emitting device 10B. Each light emitting device (10R, 10G, 10B) that is non-functional because it functionally fails or is missing because it was not bonded to the backplane (e.g., due to a failed bonding step) is represented as a black square in FIG. 4B. Each site (pixel) including a non-functional first-type light emitting device 10R is classified as a first-type defective pixel 19R, each site including a non-functional second-type light emitting device 10G is classified as a second-type defective pixel 19G, and each site including a non-functional third-type light emitting device 10B is classified as a third-type defective pixel 19B. While only three defective pixels are shown in FIG. 4B for ease of illustration, it should be noted that multiple defective pixels of the first, second and/or third-types may be present on the backplane 50.

A test map is generated, which includes markings of all types of defective light emitting devices (10R, 10G, 10B). The test map represents coordinates of all repair sites 11 in the defective pixels (19R, 19G, 19B), which can include the first-type defective pixels 19R, the second-type defective pixels 19G, and the third-type defective pixels 19B. Type-specific derivative test maps including location of only the first-type defective pixels 19R, the second-type defective pixels 19G, or the third-type defective pixels 19B can also be generated.

Repair sites 11 in the light emitting device assembly can be identified based on the test map, or a set of type-specific test maps. Each of the repair sites 11 is an empty site configured to accommodate a respective repair light emitting device and is located within a pixel U1 including a defective instance of the light emitting device 10R of the first type, a defective instance of the light emitting device 10G of the second type, or a defective instance of the light emitting device 10B of the third type. A first-type repair site 11 is an empty site within a first-type defective pixel 19R, a second-type repair site 11 is an empty site within a second-type defective pixel 19G, and a third-type repair site 11 is an empty site within a third-type defective pixel 19B.

Referring to FIG. 5, the light emitting devices 10 in the device supply region 200 of the substrate 1 (which may be a growth substrate) can be tested for functionality. A functional (i.e., non-defective) subset of the light emitting devices 10 (i.e., the known good die, "KGD") can be identified by electrical and/or optical testing. The KGD devices 10 can be selectively transferred to a first transfer substrate 400. The first transfer substrate 400 may be a film frame which supports a UV release tape or film. The first transfer substrate 400 may have any suitable shape, such as a substantially circular shape which corresponds to the shape of the growth substrate 1.

The KGD devices 10 from region 200 of the growth substrate 1 can be selectively transferred to the first transfer substrate 400 using any suitable method, such as a laser lift off method. In one embodiment, the growth substrate 1 can comprise a bulk material portion, such as a sapphire wafer, a glass plate or other optically transparent material known in the art that is transparent to a laser beam, and a release layer located between the devices 10 and the bulk material portion. The laser beam from a laser can pass through the bulk material portion prior to impinging on the release layer located under each KGD device 10. However, the laser beam is not provided to the release layer located under the defective devices 10. The laser beam can ablate each surface portion of the release layer under each KGD device 10. In one embodiment, the release layer can include silicon nitride or a semiconductor material (such as GaN) that is ablated upon absorption of the laser beam. In this case, the laser wavelength can be an ultraviolet wavelength (such as 248 nm or 193 nm). Preferably, the devices 10 are placed in contact with the first transfer substrate (e.g., with an adhesive UV release tape on the frame) 400 and the laser is irradiated through the substrate 1 to ablate the release layer and to release the KGD devices 10 such that they are adhered to the first transfer substrate 400 and are not attached to the growth substrate 1. The defective devices 10 remain attached to the growth substrate 1, which can produce a skipped (i.e., empty) site 402 on the first transfer substrate 400.

For example, as shown in FIG. 5, the growth substrate 1 is a substrate that contains red light emitting devices 10R. Thus, the growth substrate 1 may be used to transfer red light emitting devices 10R to the first transfer substrate 400. Similar process may be used to transfer blue and green light emitting devices from their respective growth substrates to the respective transfer substrates. Thus, the above process can be repeated for each type of light emitting devices 10 such that three separate first transfer substrates with respective first-type light emitting devices 10R, second-type light emitting devices 10G and third-type light emitting devices 10B thereupon can be prepared.

As shown in the insets in FIG. 5, the devices 10R contain a p-n junction (which may include an intrinsic layer or layers to form a p-i-n junction) which is grown with the n-type side contacting the substrate 1 and the p-type side located over the n-type side. After the transfer of the devices 10R to the first transfer substrate 400, the p-type side contacts the substrate 400 and the n-side is located over the p-side. In other words, the devices 10R are flipped up-side-down after the transfer to the substrate 400. If the devices 10 are formed with the p-side contacting the substrate 1, then the p-side and n-side locations are reversed from those described above.

In one embodiment, the functional subset of the light emitting devices 10 transferred to the first transfer substrate 400 can be selected to have the same density as, or a lesser density than, the density of the light emitting devices 10 on the device supply region 200 of the growth substrate 1. For example, the base pitch region 100 can have a first density of light emitting devices 10 prior to transfer of the light emitting devices 10 therein, the device supply region 200 can have a second density of light emitting devices 10 prior to transfer of any light emitting devices 10 therefrom such that the second density is less than the first density, and the first transfer substrate 400 can have a third device density of transferred subset of the light emitting devices 10 such that the third density is the same as, or is less than, the second density. In one embodiment, the third density can be in a range from 1% to 100% of the second density. In one embodiment, the third density can be in a range from 4% to 25% of the second density. The reduction in the density of light emitting devices 10, if employed, on the first transfer substrate 400 can be advantageously employed to facilitate subsequent transfer processes for the light emitting devices 10 from the first transfer substrate 400 to a second transfer substrate in a subsequent processing step by reducing potential mechanical overlaps during the transfer process.

Figure 6:
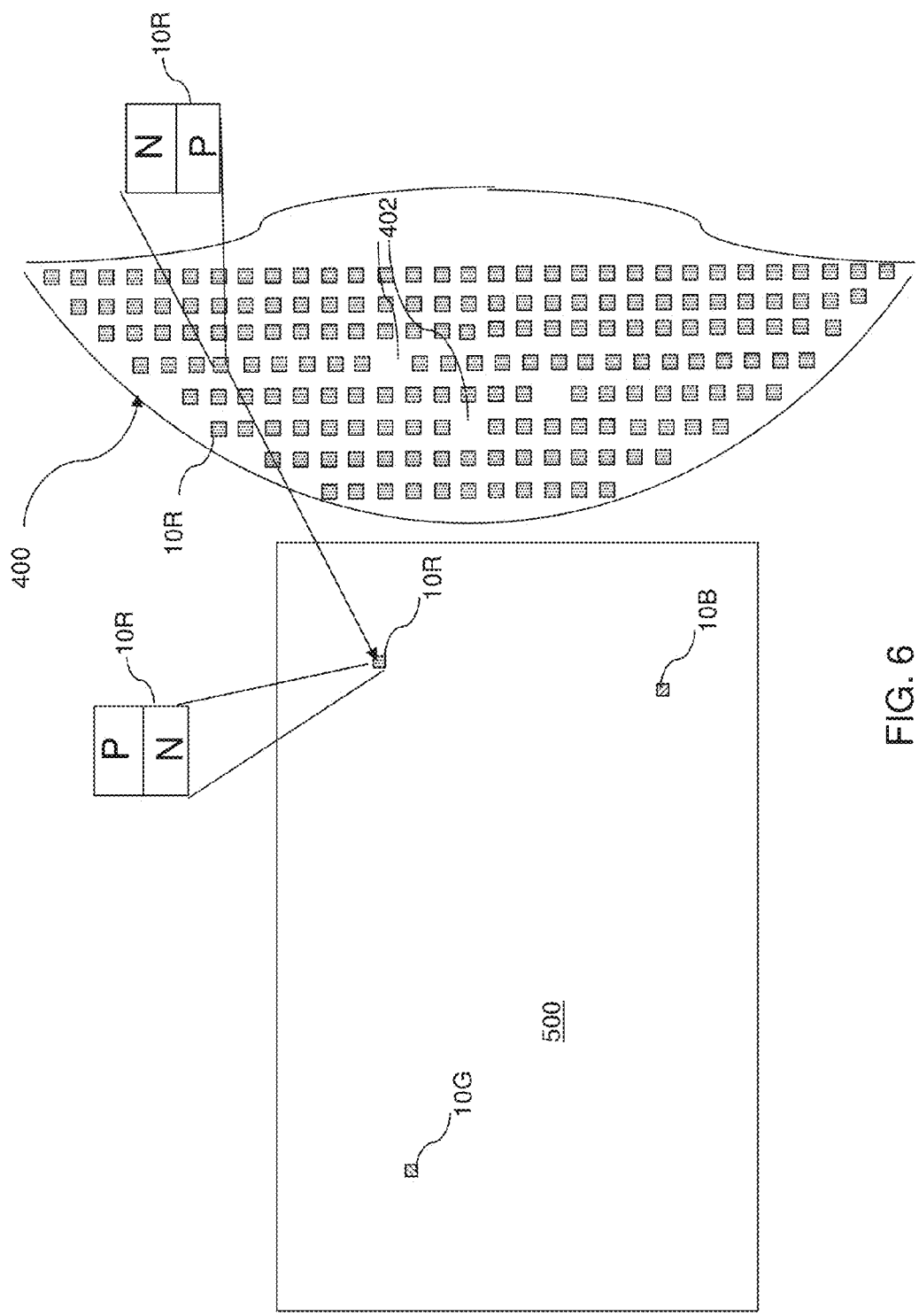
FIG. 6 is a plan view showing a step of transfer of dies from the first transfer substrate to a second transfer substrate (e.g., a repair head) with a mirror image of the defect map of a first backplane according to an embodiment of the present disclosure.

Referring to FIG. 6, the repair light emitting devices 10 (i.e., 10R, 10G and 10B) from each first transfer substrate 400 can be transferred to common second transfer substrate 500. FIG. 6 shows a step of transferring the red light emitting repair devices 10R to the second transfer substrate 500 after the green and blue emitting repair devices 10G and 10B have already been transferred to the second transfer substrate 500 from other first transfer substrates. The second transfer substrate 500 may comprise a repair head, such as a rectangular substrate or frame having about the same shape and size as the first backplane. The repair head may contain an adhesive UV release layer over its surface. The repair light emitting devices 10 are transferred to locations on the repair head (i.e., on the adhesive UV release layer) 500 corresponding to a mirror image of the empty sites 11 within the defective pixels 19 of the respective type on the backplane 50.

For example, first-type repair light emitting devices 10R from one first transfer substrate can be transferred to locations on the repair head 500 that are mirror images of the empty sites 11 within the first-type defective pixels 19R over the backplane 50. Second-type repair light emitting devices 10G from another first transfer substrate can be transferred to locations on the same repair head 500 that are mirror images of the empty sites 11 within the second-type defective pixels 19G over the backplane 50. Third-type light emitting devices 10B from another first transfer substrate can be transferred to locations the same repair head 500 that are mirror images of the empty sites 11 within the third-type defective pixels 19B over the backplane 50. The transfer process may include placing the repair devices 10 in contact with the adhesive tape on the repair head 500 while the repair devices 10 are supported by the first transfer substrate 400 and selectively irradiating portions of the UV release tape on the first transfer substrate 400 with UV radiation to release the desired repair devices 10 from first transfer substrate 400 to the second transfer substrate (i.e., the repair head) 500. The UV radiation may be provided to the tape through the frame if the frame is hollow or transparent to UV radiation.

As shown in the insets in FIG. 6, the devices 10R contain the p-n junction which is located with the p-type side contacting the substrate 400 and the n-type side located over the p-type side. After the transfer of the devices 10R to the second transfer substrate 500, the n-type side contacts the substrate 500 and the p-side is located over the n-side. In other words, the devices 10R are flipped up-side-down after the transfer to the substrate 500.

Figure 7:
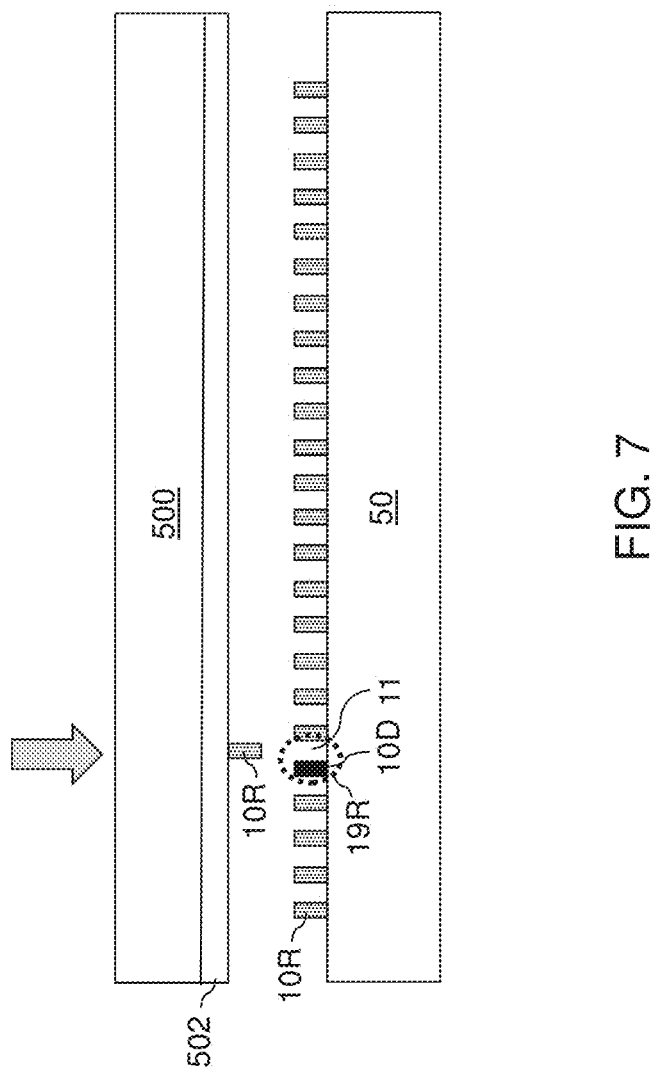

Referring to FIGS. 7 and 8A, the repair head 500 can be positioned to face the assembly of the backplane 50 and the light emitting devices 10 (provided from the central region 100 on substrate 1 or from other source) located on the release tape 502 on the repair head 500. The repair head 500 and the backplane 50 are aligned to each other such that each type of repair light emitting device 10R, 10G and 10B is positioned opposite to the empty sites 11 within the respective type defective pixels 19R, 19G and 19B containing the defective pixels 10D. The repair devices 10 are arranged on the repair head 500 in a mirror image of the location of the defective pixels 19 on the backplane 50 so that when the repair head and/or the first backplane are flipped or turned to face each other, the repair devices 10 on the repair head 500 face the empty repair sites 11 in the defective pixels 19 on the backplane 50, as shown in FIG. 8A.

The repair devices 10 and the backplane 50 are brought into contact with each other, and the 10 repair devices are bonded to the electrodes on the backplane 50 using a metal bonding process or conductive epoxy. Subsequently, the repair devices 10 are detached from the repair head 500 by UV radiation on the side of the repair devices 10 that are proximal to the repair head 500 as shown by the arrow in FIG. 7 to release the repair devices 10 from the UV release tape.

Referring to FIG. 8A, the assembly of the backplane 50 and the light emitting devices 10 thereupon is illustrated after transfer of the first repair devices. Each first-type defective pixel 19R becomes a first-type repaired pixel 20R, which includes a defective first-type light emitting device 10D and a first repair device 10R. Each first repair device is a functional first-type light emitting device located at a repair site (a previously empty site 11). Each second-type defective pixel 19G becomes a second-type repaired pixel 20G, which includes a defective second-type light emitting device and a second repair device 10G. Each second repair device is a functional second-type light emitting device located at a repair site (a previously empty site). Each third-type defective pixel 19B becomes a third-type repaired pixel 20B, which includes a defective third-type light emitting device and a third repair device 10B. Each third repair device is a functional third-type light emitting device located at a repair site (a previously empty site).

Figure 8B:
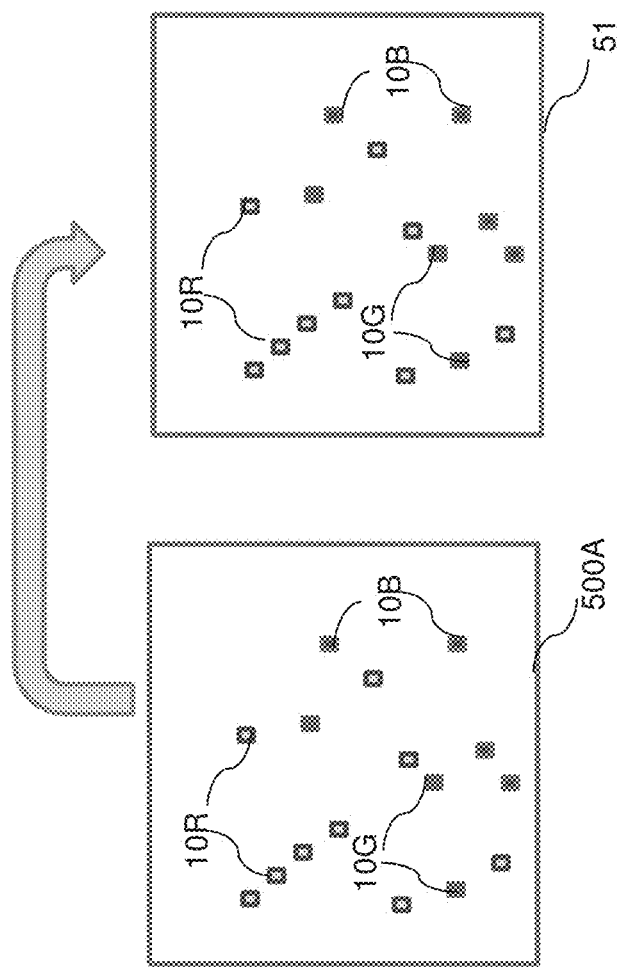

While only three repair devices 10R, 10G and 10B are shown in FIG. 8A for clarity, it should be understood that multiple devices of each type may be located on the repair head 500. For example, as shown in FIG. 8B, multiple repair devices of each type (10R, 10G and 10B) may be located on the repair head 500A. The multiple devices of each type may be transferred from the repair head 500A to the backplane 51 during the same transfer and bonding process. The repair head 500A is shown from its backside opposite to the side where the devices 10 are located to illustrate correspondence to the locations on the front of the backplane 51 after the repair head 500A and/or the backplane 51 are flipped or turned to face each other.

In the above embodiment, all KGD devices 10 are transferred from region 200 of the growth substrate 1 to the first transfer substrate 400, as shown in FIG. 5. Then, selected KGD devices 10 (i.e., the repair devices) are transferred from the first transfer substrate 400 to the second transfer substrate 500 based on the mirror image of the mapped defective pixels 19 on the backplane 50. Thus, the defect site mapping takes place between the transfer from the first to the second transfer substrate.

In an alternative embodiment shown in FIGS. 9A-9G, the defect site mapping (i.e., wafer mapping) takes place at an earlier step in the process. In this embodiment, the defect site mapping takes place between the transfer from the source substrate 1 and the first transfer substrate. Thus, in this embodiment the repair devices 10 are arranged in the same configuration on the first transfer substrate as the location of the empty repair sites 11 in the defective pixels 19 on a backplane.

As shown in FIGS. 9A and 9B, a source coupon 1 (e.g., growth substrate) and the first transfer substrate 400 are provided. The source coupon and the first transfer substrate may be the same as in the first embodiment or they may be different than in the first embodiment.

As shown in FIG. 9C, the repair devices 10 (e.g., devices 10R, 10G or 10B) are transferred from the growth substrate 1 to the first transfer substrate 400 using laser lift-off or another suitable method. In this embodiment, all three types of repair devices 10 (i.e., the red emitting devices 10R, the green emitting devices 10G and the blue emitting devices 10B) are sequentially transferred to the first transfer substrate 400 from separate growth substrates 1. For example, as shown in FIG. 9C, the green emitting devices 10G and the blue emitting devices 10B have already been transferred to the first transfer substrate 400 from the respective regions 200 of respective growth substrates 1 containing green and blue emitting devices 10G, 10B. The red emitting devices 10R are then transferred to the first transfer substrate 400 from region 200 of the growth substrate by laser lift-off, as shown by the arrows.

Figure 9F:
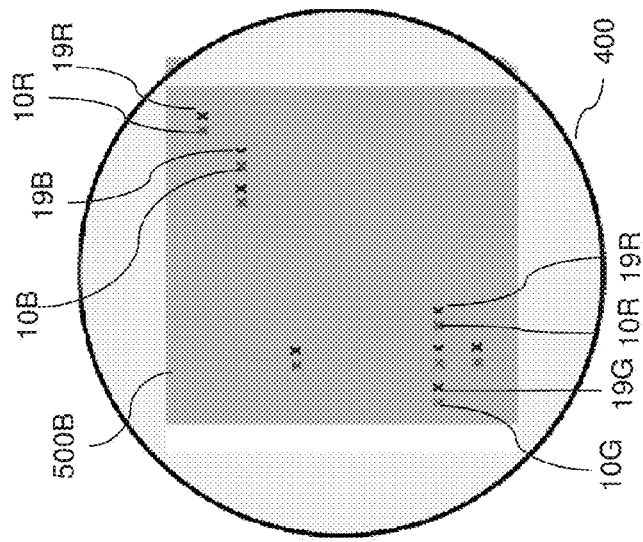
Figure 9E:
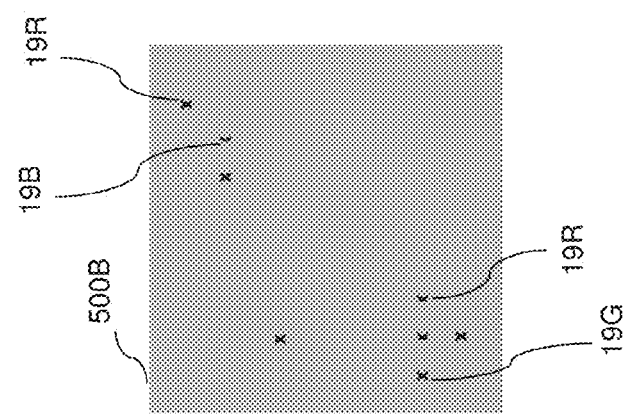
Figure 9D:
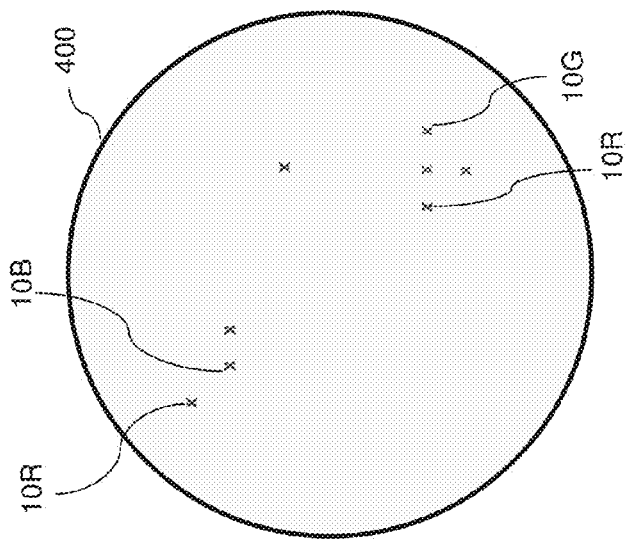

The three types of repair devices 10R, 10G and 10B are arranged on the first transfer substrate 400 at the locations of the respective empty repair sites 11 in the same type of defective pixels 19R, 19G and 19B on the backplane 52, as shown in FIG. 9D. The three types of repair devices 10R, 10G and 10B are arranged on the first transfer substrate 400 at the mirror image of locations of the respective empty repair sites 11 (corresponding to the defective pixels 19R, 19G and 19B) on the second transfer substrate (e.g., repair head) 500B shown in FIG. 9E.

As shown in FIG. 9F, the three types of repair devices 10R, 10G and 10B are transferred from first transfer substrate 400 to the mirror image of the locations of the respective empty repair sites 11 in the same type of defective pixels 19R, 19G and 19B on the second transfer substrate 500B. The same transfer method as described above with respect to FIG. 6 may be used.

Figure 9G:
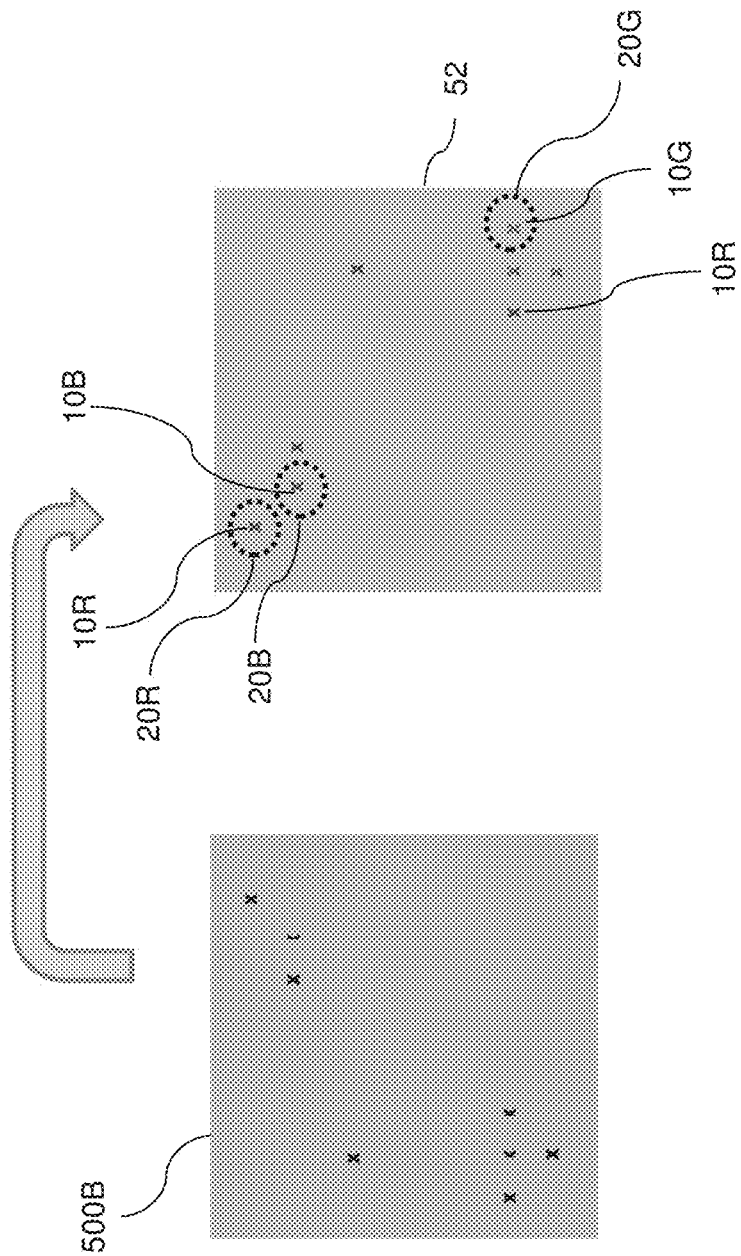

As shown in FIG. 9G, the three types of repair devices 10R, 10G and 10B are then transferred from the second transfer substrate 500 to the locations of the respective empty repair sites 11 in the same type of defective pixels 19R, 19G and 19B on the backplane 52. The same transfer method as described above with respect to FIGS. 7 and 8A may be used. The repair devices 10R, 10G and 10B may then be bonded in the repair sites 11 on the backplane using a metal bonding process or a conductive epoxy to form respective repaired pixels 20R, 20G and 20B.

In the embodiment described above, the repair light emitting devices and the central light emitting devices located on one backplane are transferred from the same growth substrate 1. However, in other embodiments, the repair light emitting devices and the central light emitting devices located on one backplane are transferred from the different growth substrates 1. In other words, the central light emitting devices from a first growth substrate may be transferred to a first backplane and the repair light emitting devices from the same first growth substrate may be transferred to a different backplane which contains central light emitting devices from a different second growth substrate.

In all of the embodiments described above, the light emitting devices 10 (e.g., the central and repair devices) may comprise in and/or organic light emitting diodes. In one embodiment, the red emitting, green emitting and blue emitting devices 10R, 10G and 10B may comprise inorganic light emitting diodes. In another embodiment, the red emitting devices 10R may comprise organic light emitting diodes while the green and blue emitting devices 10G and 10B may comprise inorganic light emitting diodes located in the same pixel on the same backplane as the organic light emitting diodes 10R. Thus, the same backplane (e.g., 50, 51 or 52 shown in FIG. 8A, 8B or 9G) of a direct view display device 10 may contain both organic and inorganic light emitting diodes. The use of both organic and inorganic light emitting diodes on the same backplane may be advantageous because organic light emitting diodes may have better red emission characteristics for direct view displays, while inorganic light emitting diodes may have better green and blue emission characteristics for the direct view displays. As used herein, organic light emitting diodes contain organic light emitting layers, such as polymer and/or small molecule light emitting layers. The polymer semiconductor electroluminescent layers may comprise undoped polymers (e.g., derivatives of poly(p-phenylene vinylene) (PPV), poly(naphthalenevinylene) or polyfluorine) or doped polymers (e.g., poly(N-vinylcarbazole) host material with organometallic complex (e.g., platinum or iridium complex) dopant which use electrophosphorescence to convert electrical energy into light). Inorganic light et g diodes include Group IV, Group III-V or Group II-V inorganic semiconductor light emitting materials. For example, gallium nitride, indium gallium nitride or aluminum gallium nitride may be used as the light emitting materials. The inorganic semiconductor light emitting diodes may have nanowire active regions or they may have bulk planar active regions.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A method of repairing a light emitting device assembly, comprising:
   providing a light emitting device assembly including a backplane and light emitting devices, wherein a predominant subset of pixels in the light emitting device assembly includes an empty site for accommodating a repair light emitting device;
   generating a test map that identifies non-functional light emitting devices in the light emitting device assembly;
   providing an assembly of a repair head and repair light emitting devices, wherein the repair light emitting devices are located only on locations that are mirror images of empty sites within defective pixels that include non-functional light emitting devices; and
   transferring the repair light emitting devices from the repair head to the backplane in the empty site in the defective pixels.

2. The method of claim 1, further comprising:
   transferring the repair light emitting devices from a growth substrate to a first transfer substrate; and
   transferring the repair light emitting devices from the first transfer substrate to the repair head, wherein the light emitting devices that are present in the tested light emitting device assembly and the repair light emitting devices on the backplane contain a p-n junction that is arranged in the same direction.

3. The method of claim 2, wherein each of the repair light emitting devices is transferred twice more than an individual light emitting device in the tested light emitting device assembly and the repair head has a same shape as the backplane.

4. The method of claim 2, wherein:
   the step of transferring the repair light emitting devices from a growth substrate to a first transfer substrate is performed by laser lift-off;
   the step of transferring the repair light emitting devices from the first transfer substrate to the repair head is performed by selectively exposing a first UV release tape on the first transfer substrate to UV radiation; and
   the step of transferring the repair light emitting devices from the repair head to the backplane is performed by selectively exposing a second UV release tape on the repair head substrate to UV radiation.

5. The method of claim 1, wherein:
   the step of transferring the repair light emitting devices from a growth substrate to a first transfer substrate comprises:
      transferring first type of repair light emitting devices from a first growth substrate to a first type first transfer substrate;
      transferring second type of repair light emitting devices from a second growth substrate to a second type first transfer substrate; and
      transferring third type of repair light emitting devices from a third growth substrate to a third type first transfer substrate; and
   transferring the repair light emitting devices from the first transfer substrate to the repair head comprises transferring the first, the second and the third types of repair devices from the respective first, second and third types of first transfer substrates to the repair head.

6. The method of claim 1, wherein:
   the step of transferring the repair light emitting devices from a growth substrate to a first transfer substrate comprises:
      transferring first type of repair light emitting devices from a first growth substrate to the first transfer substrate;
      transferring second type of repair light emitting devices from a second growth substrate to the first transfer substrate; and
      transferring third type of repair light emitting devices from a third growth substrate to the first transfer substrate; and
   transferring the repair light emitting devices from the first transfer substrate to the repair head comprises transferring the first, the second and the third types of repair devices from the same first transfer substrate to the repair head.

7. The method of claim 6, wherein the first, the second and the third types of repair devices are arranged on the first transfer substrate in the same configuration as the location of the empty sites in the defective pixels on the backplane.

8. The method of claim 1, wherein:
the light emitting devices on the tested light emitting device assembly includes multiple types of light emitting devices that emit light at different peak wavelengths; and
the test map identifies multiple types of non-functional light emitting devices.

9. The method of claim 1, wherein:
multiple types of repair light emitting devices are transferred from the repair head to the backplane; and
each repair light emitting device is of a same type as a non-functional light emitting device that is located within the defective same pixel at a respective mirror image empty site on the backplane.

10. The method of claim 1, wherein the light emitting device assembly comprises direct view display and the light emitting devices comprise red, green and blue emitting light emitting diodes.

11. A method of manufacturing an assembly of a backplane and light emitting devices, comprising:
providing a plurality of growth substrates each comprising a central region containing central light emitting devices and a peripheral region containing repair light emitting devices;
transferring the central light emitting devices from the central region of at least one of the plurality of growth substrates to a backplane to form a light emitting device assembly including the backplane and the transferred light emitting devices, wherein a predominant subset of pixels in the light emitting device assembly includes an empty site for accommodating the repair light emitting device;
generating a test map that identifies non-functional light emitting devices in the light emitting device assembly;
transferring the repair light emitting devices from the peripheral region of at least one of the plurality of growth substrates to a first transfer substrate;
transferring the repair light emitting devices from the first transfer substrate to a second transfer substrate; and
transferring the repair light emitting devices from the second transfer substrate to the backplane in the empty site in the defective pixels.

12. The method of claim 11, wherein the repair light emitting devices and the central light emitting devices located on one backplane are transferred from the same one of the plurality of growth substrates.

13. The method of claim 11, wherein the repair light emitting devices and the central light emitting devices located on one backplane are transferred from different ones of the plurality of growth substrates.

14. The method of claim 11, wherein the repair light emitting devices are arranged in the peripheral region at a lower density than a density of the central light emitting devices arranged in the central region.

15. The method of claim 11, wherein the central light emitting devices and the repair light emitting devices on the backplane contain a p-n junction that is arranged in the same direction.

16. The method of claim 11, wherein the light emitting device assembly comprises direct view display and the light emitting devices comprise red, green and blue emitting light emitting diodes.

* * * * *